(12) United States Patent
Pope et al.

(10) Patent No.: US 6,724,327 B1
(45) Date of Patent: Apr. 20, 2004

(54) LOWER LATENCY CODING/DECODING

(75) Inventors: Stephen P. Pope, Berkley, CA (US); John T. Coffey, San Francisco, CA (US); Srikanth Gummadi, Rohnert Park, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/447,400

(22) Filed: May 29, 2003

(51) Int. Cl.$^7$ ................................................ H03M 7/40
(52) U.S. Cl. ............................................ 341/67; 341/50
(58) Field of Search .......................... 341/67, 50, 51; 375/240; 714/755; 382/238

(56) References Cited

U.S. PATENT DOCUMENTS 6,088,393 A * 7/2000 Knee et al. ................. 375/240
6,603,413 B2 * 8/2003 Igarashi et al. ............... 341/67
6,636,641 B1 * 10/2003 Kimura et al. .............. 382/238
6,643,814 B1 * 11/2003 Cideciyan et al. .......... 714/755

* cited by examiner

*Primary Examiner*—Jean Jeanglaude
(74) *Attorney, Agent, or Firm*—J. Dennis Moore; W. James Brady, III; Frederick J. Telecky, Jr.

(57) ABSTRACT

An electronic device may receive a packet comprising a plurality of codewords comprising pre-processing logic, a first decoder, and a second decoder. The pre-processing logic causes some of said codewords to be provided to the first decoder and other of said codewords to be provided to the second decoder. The codewords may be of different lengths and/or different code rates. Further, the first and second decoders may implement the same or different decoding technique.

40 Claims, 1 Drawing Sheet

LOWER LATENCY CODING/DECODING

BACKGROUND OF THE INVENTION

1. Field of the Invention

The present invention generally relates to communication systems. More particularly, the invention generally relates to lower latency decoding techniques usable in communication systems.

2. Background Information

In general, communication systems permit information to be transmitted from a source to a destination. An issue that is addressed in various communication systems is how to detect errors that may occur in the transmitted information. For example, a bit may be transmitted as a logic 1, but be received as a logic 0, and vice versa. To address such errors in many types of communication systems, the transmitting device may include logic that codes the information to be sent to the destination device. The destination device may include decode logic that decodes the coded information to recreate the original information.

Numerous types of coding schemes exist. In general, a coding scheme causes redundant bits of information (e.g., parity bits) to be included with the data bits to form a "code word." The redundant bits permit the decoding logic to detect whether any of the data bits were received in error and to correct any bits received in error. Generally, longer code words are desirable to achieve higher efficiency, but disadvantageously take a longer time to decode than shorter code words. By contrast, shorter codes advantageously can be decoded faster than longer code words, but are less efficient than longer code words (i.e. may require more redundant bits per set of data bits). Coding schemes may be characterized by a "coding rate" which refers to the portion of the total number of bits in a packet or code word that comprise data bits (as opposed to redundant/parity bits). As such, more redundant bits per set of data bits may be required to achieve similar reliabilities for decoded bits. By way of additional terminology, the "error rate" refers to the number of bits in error received as a percentage of the total bits transmitted.

By way of an example, turbo codes generally comprise a large class of iterative near-channel-capacity error correction codes. By their nature, turbo codes are relatively compute-intensive and suffers from longer latency than other coding schemes. As used herein, latency refers to the time interval from the point when a codeword has been received in its entirety to the time at which the entire codeword has been decoded and all of the recovered data bits are available for further use. Turbo codes, however, permits a desired error rate to be achieved with a higher coding rate than other types of coding schemes. Thus, turbo codes may suffer from higher latency, but may also be characterized by higher efficiency than other coding schemes.

The longer latency of coding schemes like turbo codes may be acceptable for some applications, but not others. At least some wireless networks (e.g., networks compliant with the IEEE 802.11 standard) require a packet to be acknowledged within a prescribed amount of time. This means that the receiving device must decode the packet fast enough to be able transmit back an acknowledgment within the time prescribed by the applicable wireless standard. The relatively long latency typical of turbo codes makes it difficult to implement turbo codes in a network that requires relatively fast decoding. Faster decoding schemes may be needed, but such schemes may be undesirably inefficient.

BRIEF SUMMARY

The problem described above may be solved by an electronic device that is adapted to receive a packet comprising a plurality of codewords comprising pre-processing logic, a first decoder, and a second decoder. The pre-processing logic causes some of said codewords to be provided to the first decoder and other of said codewords to be provided to the second decoder. The codewords may be of different lengths and/or different code rates. Further, the first and second decoders may implement the same or different decoding technique.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, different companies may refer to a component and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either a direct or indirect connection. Thus, if a first device couples to a second device, that connection may be through a direct connection, or through an indirect connection via other devices and connections. To the extent that any term is not specially defined in this specification, the intent is that the term is to be given its plain and ordinary meaning.

DETAILED DESCRIPTION OF PREFERRED EMBODIMENTS OF THE INVENTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
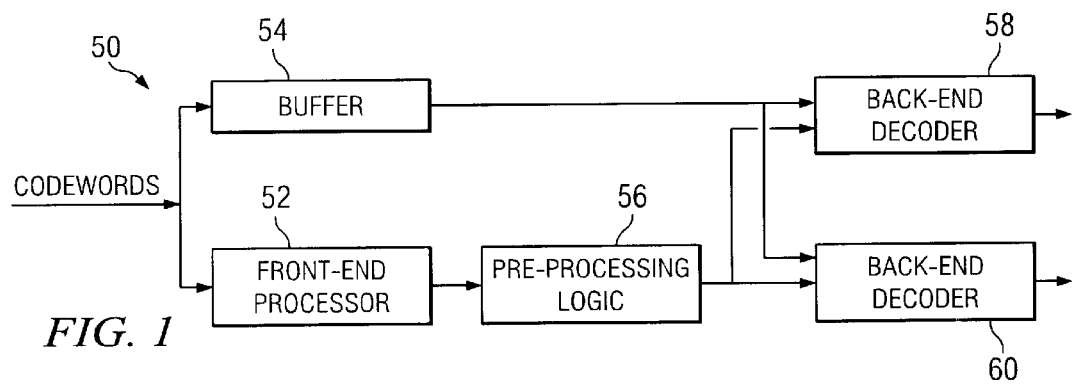
FIG. 1 illustrates decode logic usable in a communication device in accordance with a preferred embodiment of the invention.

Referring to FIG. 1, at least a portion of an electronic device 50 is shown configured in accordance with a preferred embodiment. As shown, electronic device 50 may include a front-end processor 52, a buffer 54, pre-processing logic 56, and back-end decoders 58 and 60. The components shown in FIG. 1 generally comprise decode logic which may be included in the electronic device 50. Such decode logic generally decodes codewords transmitted to the electronic device 50 by a transmitting device. The decode logic thus receives the codewords, decodes the codewords and provides the recovered (i.e., decoded) information to further logic (not shown) which may process the information. The electronic device 50 thus may include transceivers to communicate with other communication devices and a processor, memory and other components to process the decoded data. The electronic device 50 may be any type of device usable to send and/or receive coded information from one or more other devices. In some embodiments, the electronic device 50 may comprise a wireless device compliant with any suitable wireless standard such as IEEE 802.11.

Referring still to FIG. 1, the codewords may be provided to both the front-end processor 52 and buffer 54. The front-end processor may compute preliminary probabilities as to whether each bit received is a "0" or a "1". The buffer 54 may comprise a storage medium such as random access memory. The codewords stored in the buffer 54 subsequently may be retrieved and provided to either or both of the back-end decoders 58, 60 which may function as described below.

From the front-end processor 52, the data may be provided to the pre-processing logic 56. The pre-processing logic 56 receives the codewords and determines which of the back-end decoders 58, 60 is to decode each codeword. Although only two back-end decoders are shown in FIG. 1, in general, any number of back-end decoders may be included.

Each back-end decoder 58, 60 implements a decoding scheme. In some embodiments, the back-end decoders may implement turbo decoding, but other types of decoding schemes may be implemented as well. The decode logic depicted in FIG. 1 may receive a packet comprising a plurality of codewords. The results of the front-end processor 52 and the codewords stored in buffer 54 are provided to the back-end decoders 58, 60. In accordance with the preferred embodiment, some codewords are provided to decoder 58, while other codewords are provided to decoder 60. Pre-processing logic 56 controls the dissemination of the codewords to the back-end decoders 58, 60. In general, the back-end decoders 58, 60 may function concurrently. Concurrent, parallel back-end decoders 58, 60 may permit the codewords to be decoded in less total time than if only a single decoder was provided.

Figure 2:
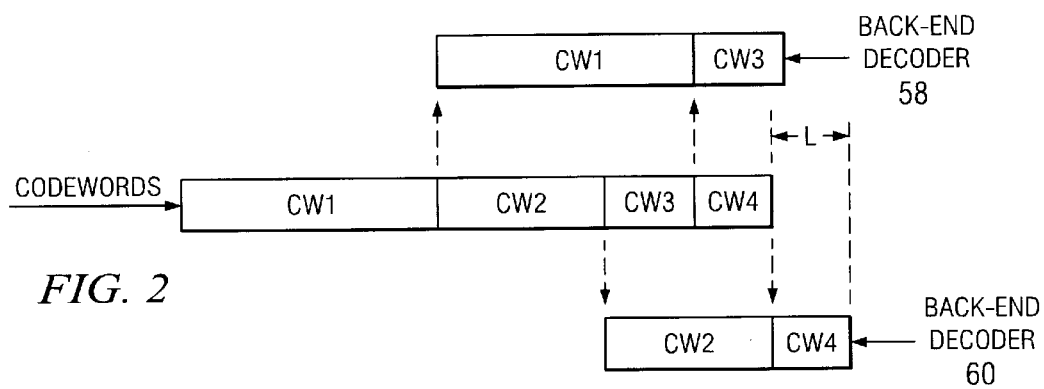
FIG. 2 illustrates the operation of the decode logic of FIG. 1 on a plurality of codewords.

FIG. 2 provides an example of how the codewords may be divided among the back-end decoders 58, 60. As shown, a packet containing four codewords (CW1–CW4) may be transmitted to the electronic device 50. Although not necessarily drawn to scale, one or more of the codewords may have a length (i.e. number of bits) that is different from at least one other codeword. In the example of FIG. 2, each successive codeword may be shorter than the preceding codeword. Thus, CW1 is longer than CW2, CW2 is longer than CW3, and CW3 is longer than CW4. In some situations to ensure that the decoding device can process a stream of blocks, it may be desirable that a codeword can be decoded in less time than it takes for the electronic device 50 to receive the codeword. As such, a codeword may be decoded in X% of the time it takes to receive the codeword, where X may vary from application to application. In accordance with a preferred embodiment, each successive codeword is formed to be X% as long as the preceding codeword. By way of an example, if each codeword is decoded in 60% of the time it takes to receive the codeword, then CW2 preferably is 60% as long as CW1, CW3 preferably is 60% as long as CW2, and CW4 preferably is 60% as long as CW3. The codewords may be formed by the transmitting device. Thus, the transmitting device forms the codewords as described herein.

By shortening each successive codeword, the resulting series of codewords can be decoded in less total time. Each codeword may be decoded upon receipt of the codeword in its entirety. The electronic device 50 begins to decode CW1 after receipt of CW1, CW2 after receipt of CW2, and so on. As shown in FIG. 2, every other codeword may be provided by pre-processing logic 56 to a back-end decoder and the remaining codewords may be provided to the other back-end decoder. In the example of FIG. 2, CW1 and CW3 are provided to back-end decoder 58 by the pre-processing logic 56, while the pre-processing logic provides CW2 and CW4 to back-end decoder 60. As such, while back-end decoder 58 is provided to CW1 to decode, the electronic device 50 is receiving CW2 and pre-processing logic 56 provides CW2 to back-end decoder 60. Then, when back-end decoder 58 is finished decoding CW1, the electronic device 50 has received CW3, which then can be provided to back-end decoder 58 which is available to decode CW3. Similarly, when back-end decoder 60 finishes decoding CW2, the electronic device 50 has received CW4 and begins piping CW4 to back-end decoder 60 which is now available for decoding CW4.

As can be seen in the example of FIG. 2, the latency generally includes both the time taken to receive the last codeword (CW4) and the latency L. Thus, the time available for completion of decoding CW3 in this configuration is longer than the time available for decoding the final codeword CW4, that is, the decoding time for CW3 may acceptably exceed the overall allowable latency L. This is also true by extension for codewords CW1 and CW2. Thus, in this configuration, codewords CW1–CW3 may be higher rate codes that each take more than L time to decode. The codeword CW4 may be a code that takes time L to decode and, to compensate for this and ensure comparable bit reliabilities, will have a lower code rate. The overall code rate in this configuration may be high, as the average is generally dominated by the earlier codewords.

Figure 3:
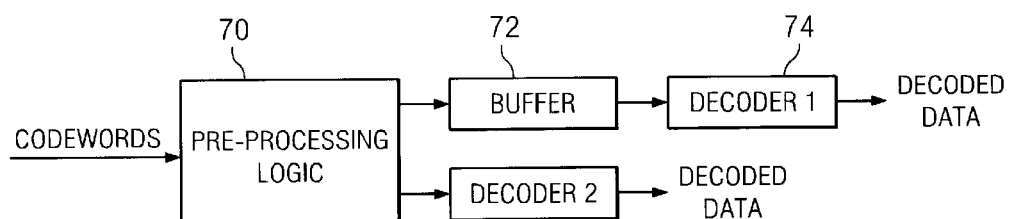
FIG. 3 illustrates decode logic usable in a communication device in accordance with another embodiment of the invention.

FIG. 3 shows another preferred embodiment of decode logic including a pre-processing logic 70, a buffer 72 and a pair of decoders 74, 76. Codewords flow into the pre-processing logic 70 which provides the codewords to either of the decoders 74, 76. Decoders 74 and 76 may implement different decoding schemes. For example, decoder 74 may implement decoding of an iterative, near-channel-capacity code (e.g., turbo decoding) turbo decoding or low density parity check codes ("LDPC"), while decoder 76 may implement decoding of a less powerful (with respect to turbo decoding), but inherently lower-latency code (e.g., Viterbi decoding or iterative decoding with fewer iteratives than decoder 74). In accordance with at least some embodiments, the decoding scheme associated with decoder 76 preferably functions with less latency than the decoding scheme of decoder 74.

Figure 4:
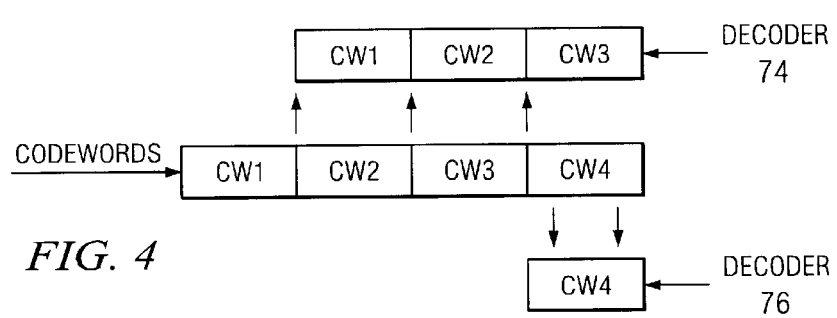
FIG. 4 illustrates the operation of the decode logic of FIG. 3 on a plurality of codewords.

FIG. 4 illustrates the operation of the decode logic of FIG. 3. As in FIG. 2, a packet including four codewords (CW1–CW4) may be serially received by the electronic device 50. As shown in FIG. 4, the first three codewords (CW1–CW3) may be provided to decoder 74 for decoding. The fourth codeword (CW4) may be provided to decoder 76 for decoding. As explained above, decoder 74 may implement a near channel capacity decoding scheme (e.g., turbo decoding), albeit with latency approximately equal to the time it takes to decode a codeword following the reception of each codeword. Codeword CW4, however, may be decoded with a decoding scheme (e.g., a breadth-first trellis decoding such as Viterbi) that results in little, if any, latency, albeit with less efficiency than the decoding scheme of decoder 74. In this embodiment, a higher efficiency decoding scheme is used for at least some of the packet and the decoding scheme switches to a faster, less latency decoding scheme when latency would otherwise become problematic. In this embodiment, the code rate of the final codeword (CW4) may be lower than that of the preceding codewords (CW1–CW3). Moreover, both decoders 74, 76 complete decoding their codewords within a relatively short time following receipt of the final codeword (CW4).

In accordance with the embodiment of FIGS. 3 and 4, each codeword may be of the same length as the other codewords. Alternatively, at least one of the codewords in the packet may be of a different length than at least one other of the codewords. Without limitation, the codewords may be graduated in length the same or similar to that shown in FIG. 2.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device that is adapted to receive a packet comprising a plurality of codewords, comprising:
   pre-processing logic;
   a first decoder; and
   a second decoder;
   wherein said pre-processing logic causes some of said codewords to be provided to the first decoder and other of said codewords to be provided to the second decoder.

2. The electronic device of claim 1 wherein said packet includes a codeword having a different length than at least one other of said codewords.

3. The electronic device of claim 1 wherein said packet comprises a plurality of varying length codewords.

4. The electronic device of claim 1 wherein said packet comprises a plurality of progressively shorter codewords.

5. The electronic device of claim 4 wherein every other codeword in said packet is provided to the first decoder for decoding and all other codewords in said packet are provided to the second decoder for decoding in parallel.

6. The electronic device of claim 1 wherein every other codeword in said packet is provided to the first decoder for decoding and all other codewords in said packet are provided to the second decoder for decoding in parallel.

7. The electronic device of claim 1 wherein said first decoder decodes some of said codewords concurrently with the second decoder other of said codewords.

8. The electronic device of claim 1 wherein the first decoder implements a different decoding scheme than the second decoder.

9. The electronic device of claim 1 wherein the first decoder implements iterative decoding and said second decoder implements breadth-first trellis decoding.

10. The electronic device of claim 1 wherein both the first and second decoders implement iterative decoding but the second decoder implements fewer iteratives than the first decoder.

11. The electronic device of claim 9 wherein said packet comprises a plurality of varying length codewords.

12. The electronic device of claim 1 wherein the first decoder implements turbo decoding and said second decoder implements Viterbi decoding.

13. The electronic device of claim 1 wherein the first decoder implement low density parity check codes and the second decoder implements Viterbi decoding.

14. The electronic device of claim 1 wherein at least one of the codewords has a code rate that is different from a code rate in at least one other codeword.

15. The electronic device of claim 14 wherein said packet comprises a plurality of varying length codewords.

16. Decode logic usable in a device that can receive packets comprising multiple codewords from at least one other device, comprising:
   pre-processing logic;
   a first decoder; and
   a second decoder;
   wherein said pre-processing logic causes some of said codewords to be provided to the first decoder and other of said codewords to be provided to the second decoder.

17. The decode logic of claim 16 wherein said packet includes a codeword having a different length than at least one other of said codewords.

18. The decode logic of claim 16 wherein said packet comprises a plurality of varying length codewords.

19. The decode logic of claim 16 wherein said packet comprises a plurality of progressively shorter codewords.

20. The decode logic of claim 19 wherein every other codeword in said packet is provided to the first decoder for decoding and all other codewords in said packet are provided to the second decoder for decoding in parallel.

21. The decode logic of claim 16 wherein every other codeword in said packet is provided to the first decoder for decoding and all other codewords in said packet are provided to the second decoder for decoding in parallel.

22. The decode logic of claim 16 wherein said first decoder decodes some of said codewords concurrently with the second decoder other of said codewords.

23. The decode logic of claim 16 wherein the first decoder implements a different decoding scheme than the second decoder.

24. The decode logic of claim 16 wherein the first decoder implements iterative decoding and said second decoder implements breadth-first trellis decoding.

25. The decode logic of claim 24 wherein said packet comprises a plurality of varying length codewords.

26. The decode logic of claim 16 wherein the first decoder implements turbo decoding and said second decoder implements Viterbi decoding.

27. The decode logic of claim 16 wherein at least one of the codewords has a code rate that is different from a code rate in at least one other codeword.

28. The decode logic of claim 27 wherein said packet comprises a plurality of varying length codewords.

29. An electronic device that is adapted to receive a packet comprising a plurality of codewords, comprising:
   a first decoder; and
   a second decoder;
   a means for causing some of said codewords to be provided to the first decoder and other of said codewords to be provided to the second decoder.

30. The electronic device of claim 29 wherein said packet comprises a plurality of progressively shorter codewords.

31. The electronic device of claim 29 wherein said means comprises a means for providing every other codeword in said packet to the first decoder to be decoded and for providing all other codewords in said packet to the second decoder to be decoded in parallel.

32. The electronic device of claim 29 wherein the first decoder implements a different decoding scheme than the second decoder.

33. A method, comprising:

receiving a plurality of codewords forming a packet;

providing at least one of said codewords to a first decoder; and providing at least one of said codewords to a second decoder;

wherein the codewords include at least one codeword that has a length different from at least one other codeword.

34. The method of claim 33 wherein at least three of the codewords are of different lengths.

35. The method of claim 33 wherein all of said codewords from said packet are of different lengths.

36. A method, comprising:

receiving a plurality of codewords forming a packet;

decoding at least one of said codewords by a first decoding scheme; and decoding at least one of said codewords by a second decoding scheme;

wherein said first and second decoding schemes are different.

37. The method of claim 36 wherein the first decoding scheme comprises near-channel-capacity decoding and the second decoding scheme comprises a decoding scheme of lower latency than the first decoding scheme.

38. The method of claim 36 wherein the first decoding scheme comprises turbo decoding and the second decoding scheme comprises Viterbi decoding.

39. The method of claim 36 wherein at least one of the codewords has a length that differs from at least one other codeword.

40. The method of claim 36 wherein all of said codewords are of different lengths.

* * * * *